(12) United States Patent
Forrest et al.

(10) Patent No.: US 6,362,069 B1
(45) Date of Patent: Mar. 26, 2002

(54) LONG-WAVELENGTH VCSELS AND METHOD OF MANUFACTURING SAME

(75) Inventors: Stephen Forrest; Milind R. Gokhale; Hongsheng Wang, all of Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/750,195

(22) Filed: Dec. 28, 2000

(51) Int. Cl.$^7$ ............................................... H01L 21/76
(52) U.S. Cl. ........................ 438/401; 438/462; 438/29; 438/45
(58) Field of Search ................................. 438/401, 462, 438/800, 400, 404, 423, 29, 45, 22–44

(56) References Cited

U.S. PATENT DOCUMENTS 5,897,329 A * 4/1999 Jewell .......................... 438/38

OTHER PUBLICATIONS

Qian, et al., "1.3 μm Vertical–Cavity Surface–Emitting Lasers with Double–Bonded GaAs–AlAs Bragg Mirrors" IEEE Phot. Tech. Lett., vol. 9, No. 1, pp. 8–10 (1997).

Qian, et al., "Long Wavelength (1.3 μm) Vertical–Cavity Surface–Emitting Lasers with a Wafer–Bonded Mirror and an Oxygen–Implanted Confinement Region" Appl. Phys. Lett. vol. 71, pp. 25–27 (1997).

Spaziani, et al., "High–Performance Substrate–Removed InGaAs Schottky Photodetectors" IEEE Phot. Tech. Lett. vol. 10, No. 8, pp. 1144–1146 (1998).

Uchiyama, et al., "Continuous–Wave Operation up to 36 °C of 1.3 μm GaInAsP–InP Vertical–Cavity Surface–Emitting Lasers"IEEE Phot. Tech. Lett. vol. 9, No. 2, pp. 141–142 (1997).

* cited by examiner

Primary Examiner—Charles Bowers
Assistant Examiner—Craig Thompson
(74) Attorney, Agent, or Firm—Wolff & Samson

(57) ABSTRACT

The present invention provides a method of manufacturing VCSELs which involves a flip-bonding process wherein the top surface of the VCSEL wafer is bonded face down onto a surrogate substrate. The process begins in a manner similar to traditional double dielectric stack based VCSEL, but then involves flip-bonding the wafer onto an In or Ag epoxy coated surrogate substrate. The InP substrate is then selectively etched. After flip-bonding the wafer fabrication proceeds on the freshly etched surface which now forms the top surface. Next, standard mesa-isolation and contact formation techniques are performed on this newly etched surface.

25 Claims, 7 Drawing Sheets

LONG-WAVELENGTH VCSELS AND METHOD OF MANUFACTURING SAME

BACKGROUND OF THE INVENTION

1. Field of the Invention

The present invention relates to long-wavelength VCSELs, methods for manufacturing same, and more particularly to a method for manufacturing such VCSELs with a flip-bonding process.

2. Related Art

Vertical cavity surface emitting lasers (VCSELs) at 1.3 μm–1.55 μm wavelength are ideal single-frequency laser sources for use in high-speed optical communications systems, including wavelength division multiplexed (WDM) applications. The advantages of VCSELs for optical communications are related to their small electrically active volume that allows direct modulation of light output at rates beyond 1 Gbps, and a circular output aperture that enables good coupling to single-mode optical fiber. However, commercially available VCSELs operate in the short wavelength range (<900 nm) making them impractical for fiber lengths over 100 m, or incompatible with a system already operating at the longer wavelengths. The main challenges facing commercialization of VCSELs operating at 1.3 μm or 1.55 μm are the sensitivity of these lasers to thermally induced effects that severely degrade their performance compared to short wavelength GaAs based devices. A particular challenge for VCSELs operating at 1.3 μm is to achieve continuous wave (CW) operation at room temperature. The problem is compounded by the fact that the InGaAsP/InP material system has poor thermal conductivity while the differential gain and quantum efficiency are more sensitive to changes in temperature compared to AlGaAs/GaAs based material.

However, efforts to achieve room-temperature operation at 1.3 μm wavelength have yielded success using two different approaches. These approaches are: (1) Dielectric multilayer mirror stacks on both sides of the active region, and (2) Single or double wafer fused interfaces to bond AlGaAs/GaAs based mirror stacks onto the InP based active region. Both approaches circumvent the need to grow high reflectivity Bragg mirrors using the InP/InGaAsP layers which have a small index difference and poor thermal properties. The wafer fused approach provides high-reflectivity AlGaAs/GaAs mirrors with low diffraction losses and low thermal resistance. Also, current can be injected uniformly into the active region via the doped AlGaAs/GaAs mirror stacks. The wafer-fusion based VCSELs thus represent a significant breakthrough solving mirror problems plaguing InP-based VCSELs. To date, fabrication has been achieved for 1.3 μm wavelength room temperature operating VCSELs using double-fused AlGaAs/GaAs mirrors, (See Qian, et al., "1.3 μm Vertical-Cavity Surface-Emitting Lasers with Double-Bonded GaAsAlAs Bragg Mirrors" IEEE Phot. Tech. Lett., Vol. 9, 8 (1997)) and for single fused oxygen-implanted confinement region with dielectric top mirror (See Qian, et al., "Long Wavelength (1.3 μm) Vertical-Cavity Surface-Emitting Lasers with a Wafer-Bonded Mirror and an Oxygen-Implanted Confinement Region" Appl. Phys. Lett. Vol. 71, 25 (1997)).

The other successful approach for room temperature CW operation at 1.3 μm wavelength uses a dielectric multi-layer stack on both sides of an InGaAsP multiple quantum well (MQW) based active region (See Uchiyama, et al., "Continuous-Wave Operation up to 36 °C. of 1.3 μm GaInAsP-InP Vertical-Cavity Surface-Emitting Lasers" IEEE Phot. Tech. Lett. Vol. 9, 141 (1997)). In this design high reflectivity mirrors are dielectric stacks (See Spaziani, et al., "High-Performance Substrate-Removed InGaAs Schottky Photodetectors" IEEE Phot. Tech. Lett. Vol. 10, 1144 (1998)), typically made of $Si/Al_2O_3$, $Si/SiO_2$ or $ZnSe/MgF_2$ layers. Current is injected under the dielectric through a ring metal contact to an InGaAs contact layer. The maximum temperature of CW operation was 35° C.

The traditional double dielectric stack based VCSEL is schematically shown in FIG. 1. The VCSEL 10 is formed on a diaphragm approximately 2 μm thick in the direction shown by arrows A. The device includes an MQW active region 12, in-grown n-DBR 13, a mesa formed on p-DBR 14, a p-type ring contact 16 formed thereon and a top dielectric stack 18 extending therethrough. The diaphragm sits on an InP substrate 20, which includes an n-type contact 22 on the bottom thereof. A bottom dielectric stack 24 extends from the underside of the wafer.

VCSELs fabricated according to the prior-art model exhibit a very high series resistance as the current has to travel almost 100 μm through a thin diaphragm to reach the active region. This thin diaphragm leads to poor mechanical stability and low thermal conductivity making room temperature CW operation difficult to achieve.

What is needed, and has not heretofore been developed, is a low cost, high yield method for producing high performance InP based VCSELs which can achieve continuous wave operation at room temperature.

OBJECTS AND SUMMARY OF THE INVENTION

It is a primary object of the invention to provide a method for producing high performance InP based VCSELs operating at wavelengths used in optical communications systems and networks.

It is an additional object to provide high performance VCSELs which can achieve continuous wave operation at temperatures higher than room temperature.

It is a further object of the invention to provide a low cost method of producing high performance VCSELs.

It is a still further object of the invention to provide high performance VCSELs with reduced series resistance.

It is yet another object of the invention to provide high performance VCSELs having improved mechanical rigidity.

It is still another object of the invention to provide a method for making long-wavelength VCSELs using a flip-bonding technique.

The present invention provides a method of manufacturing VCSELs that involves a flip-bonding process wherein the top surface of the VCSEL wafer is bonded face down onto a surrogate substrate. The process begins in a manner similar to traditional double dielectric stack based VCSEL, but then involves flip-bonding the wafer onto a metal (for example, indium or silver), or a metal-loaded epoxy coated surrogate substrate. The InP substrate is then removed by selective etching. After flip-bonding, the wafer fabrication proceeds on the freshly etched surface which now forms the top surface. Next, standard mesa-isolation and contact formation techniques are performed on this newly etched surface.

BRIEF DESCRIPTION OF THE FIGURES

Other important objects and features of the invention will be apparent from the following Detailed Description of the Invention taken in connection with the accompanying drawings in which.

DETAILED DESCRIPTION OF THE INVENTION

The present invention provides a new approach to VCSEL processing that is simple and can lead to high performance InP based VCSELs. The method of the present invention is based on the strengths of dielectric and wafer-fused techniques for VCSELs. It combines highly reliable dielectric stacks as mirrors with the low thermal resistance of a metal bonded surface adjacent to the active region. Moreover, by using a novel alignment scheme, the top and bottom apertures on the two mirror stacks are exactly aligned eliminating the need for current to flow along a thin diaphragm to reach the active region. This significantly reduces the high series resistance plaguing the conventional double dielectric mirror based VCSEL. Also bonding the thin diaphragm via a metal such as indium will drastically improve the mechanical rigidity when compared to double dielectric VCSEL structure.

Figure 1:
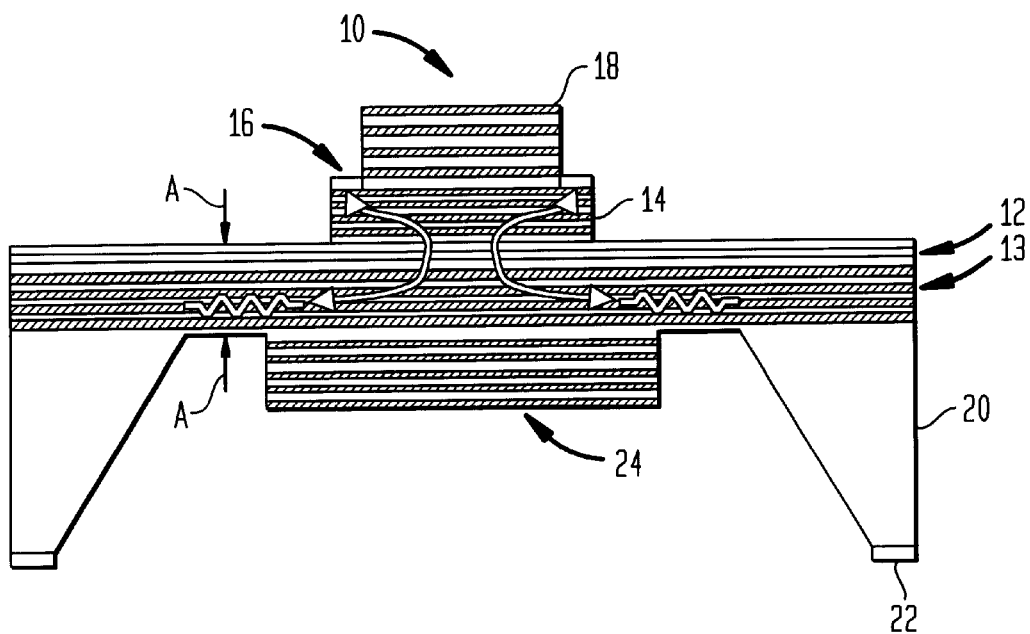
FIG. 1 is a schematic depiction of a conventional double dielectric stack based VCSEL.

The processing steps for fabricating a flip-bonded VCSEL are schematically shown in FIGS. 2a–f. The process begins in a manner similar to that of traditional double dielectric stack based VCSEL (such as shown in FIG. 1), but then involves flip-bonding the wafer onto metal (e.g. indium, silver) or metal-loaded epoxy coated surrogate substrate. The InP substrate is then removed by selective etching. After flip-bonding, the wafer fabrication proceeds on the freshly etched surface which now forms the top surface. For an exemplary embodiment, and standard mesa-isolation and contact formation techniques are performed on this etched surface.

Figure 2A:
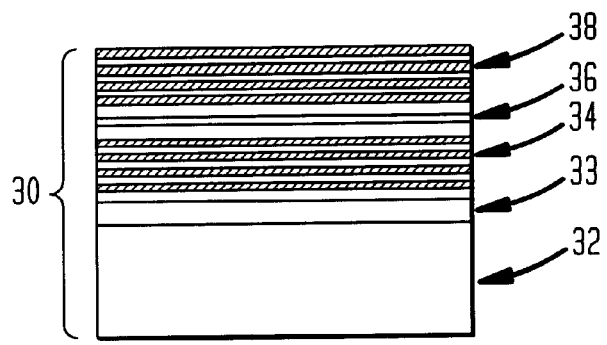
FIGS. 2a–2f provide schematic illustration of the processing steps for fabricating a VCSEL according to the present invention.
Figure 2B:
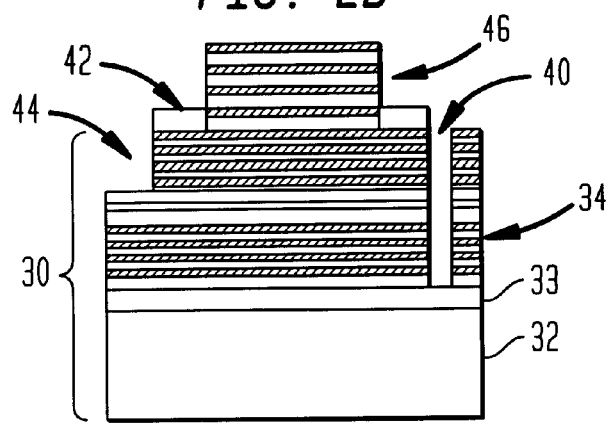
Figure 2C:
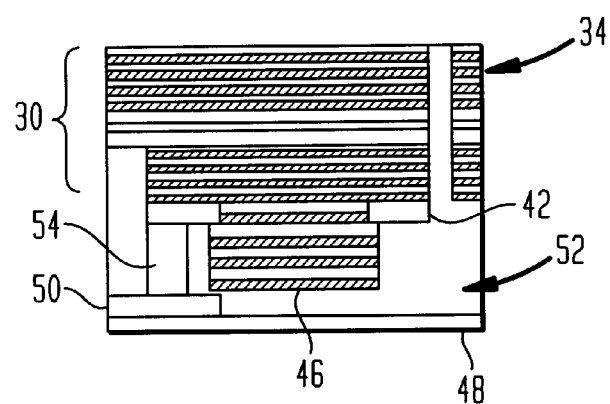
Figure 2D:
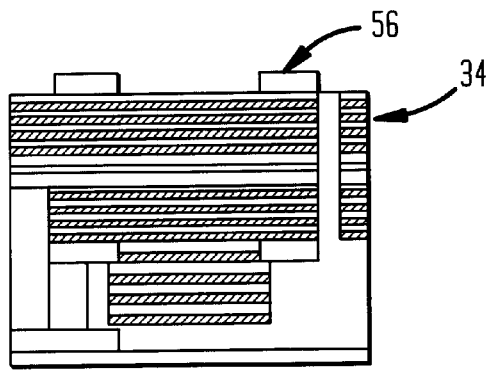
Figure 2E:
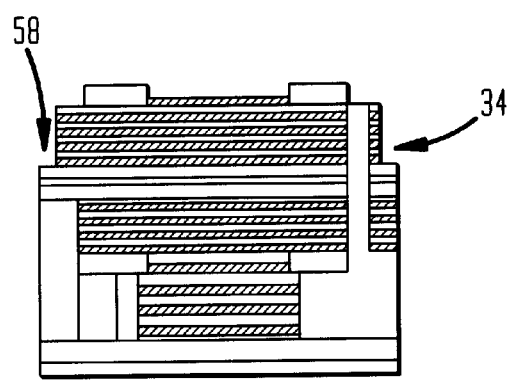
Figure 2F:
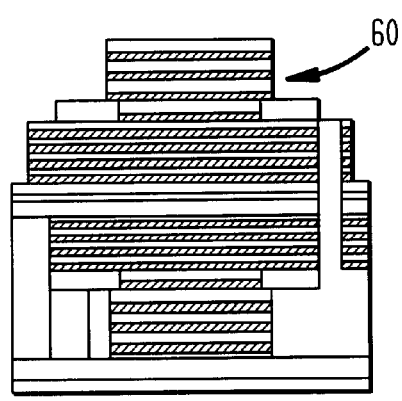

The particular processing steps are described below in conjunction with FIGS. 2a–f:

a. With reference to FIG. 2a, the wafer 30 is grown on an InP substrate (32). It typically comprises a standard 1.3 μm or 1.55 μm InGaAsP MQW gain region (36) with a 4.5 pair InGaAsP/InP distributed Bragg reflector (DBR) stack on each side (38 and 34) of the MQW (36), and separated from substrate 32 by etch-stop layer 33. The cut-off wavelength of the InGaAsP in both top (38) and bottom (34) DBR should be shorter than the emission wavelength of the MQW (36). The top DBR stack (38) is of one conductivity type (e.g. p-type) whereas the bottom DBR (34) is of the opposite conductivity type (e.g. n-type).

b. Referring to FIG. 2b, the process goes on to form via holes/registration marks (40) by wet or dry etching through the whole structure and stop before the substrate. Then, the VCSEL aperture is formed using Ti—Pt—Au or Ti—Ni—Au contact metallization 42 (p-type) on top of the p-type grown DBR (38). Next, mesa (44) is formed by plasma etching, followed by depositing 6~8 pairs of dielectric stack (e.g. Si/SiO$_2$, ZnSe/MgF$_2$, SiC/MgO) by evaporation or sputtering to form top dielectric mirror (46), and lifting-off everywhere except at each VCSEL opening using standard photolithographic patterning technology. In-situ optical monitoring techniques, such as ellipsometry or reflectometry, can be used to ensure accurate control of the thickness and optical constants of the deposited dielectric materials.

c. FIG. 2c shows flip-bonding the processed wafer (30) onto a surrogate substrate (48), which is pre-coated with metal pads and interconnects (50). Indium bumps (54) are deposited to both the wafer (30) and the substrate (48). The wafer (30) is pressed against the surrogate substrate (48) at elevated temperature with the indium bumps aligned, so that the metal top contact (42) is bonded to the metal pad (50). The indium bumps (54) and the bonded surface are protected against acid by thermally conductive, low viscosity under-filling epoxy (52). The InP substrate (32) is then removed (by etching) using HCl:H$_3$PO$_4$ mixture which selectively etches InP while stopping (i.e. not etching) at the InGaAs etch-stop layer (33) at the bottom of the DBR stack (34).

d. A standard photolithographic patterning and lift-off process is used to deposit Ti—Au non-annealed contact (56) on top of the DBR stack (34), leaving the VCSEL window (51) open, as shown in FIG. 2d. The contact (56) is aligned to the features on the bonded surface by aligning to the via holes/registration marks, which is exposed after InP substrate removal. The etch-stop InGaAs layer (33) is etched by mixture of citric acid and hydrogen peroxide, using the electrode (56) as mask.

e. FIG. 2e shows the formation of mesa to isolate each VCSEL by plasma etching through the DBR stack (34) down to near the active region, the mesa being generally indicated at (58). E-beam evaporated or sputtered SiO$_2$ or SiN$_x$ can be used as etch mask material.

f. As shown in FIG. 2f, 4~6 pairs of dielectric stack (e.g. Si/SiO$_2$, ZnSe/MgF$_2$, SiC/MgO) are deposited by evaporation or sputtering to form dielectric mirror (60) and lifting-off everywhere except at each VCSEL opening using standard photolithographic patterning technology.

The resulting VCSEL has at least two very significant advantages:

1. The thermally conducting under-filling epoxy used in the flip-bonding process is in close contact with most of the semiconductor surface, resulting in an active region bound on both sides by dielectric mirror stacks and mounted on an excellent thermal heat sink.

2. The high series resistance in conventional dielectric VCSELs due to the current flow along a thin diaphragm is completely eliminated. The current flows vertically between the top and bottom contacts aligned within ±2 μm in the lateral direction.

Figure 3A:
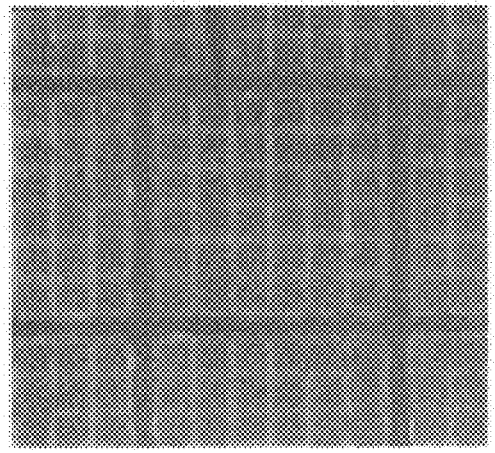
FIGS. 3a–3b provide infrared micrographs of a VCSEL structure fabricated according to the method of the invention when it is turned off (3a) and on (3b).
Figure 3B:
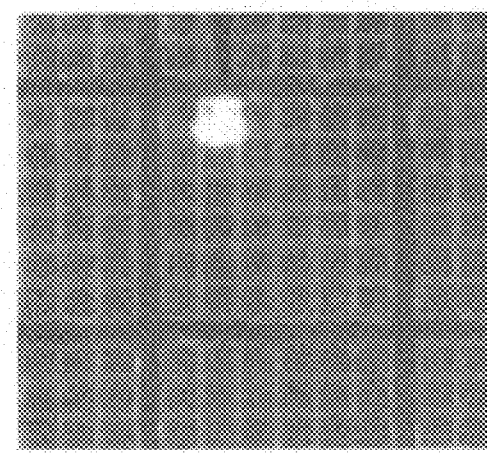
Figure 3C:
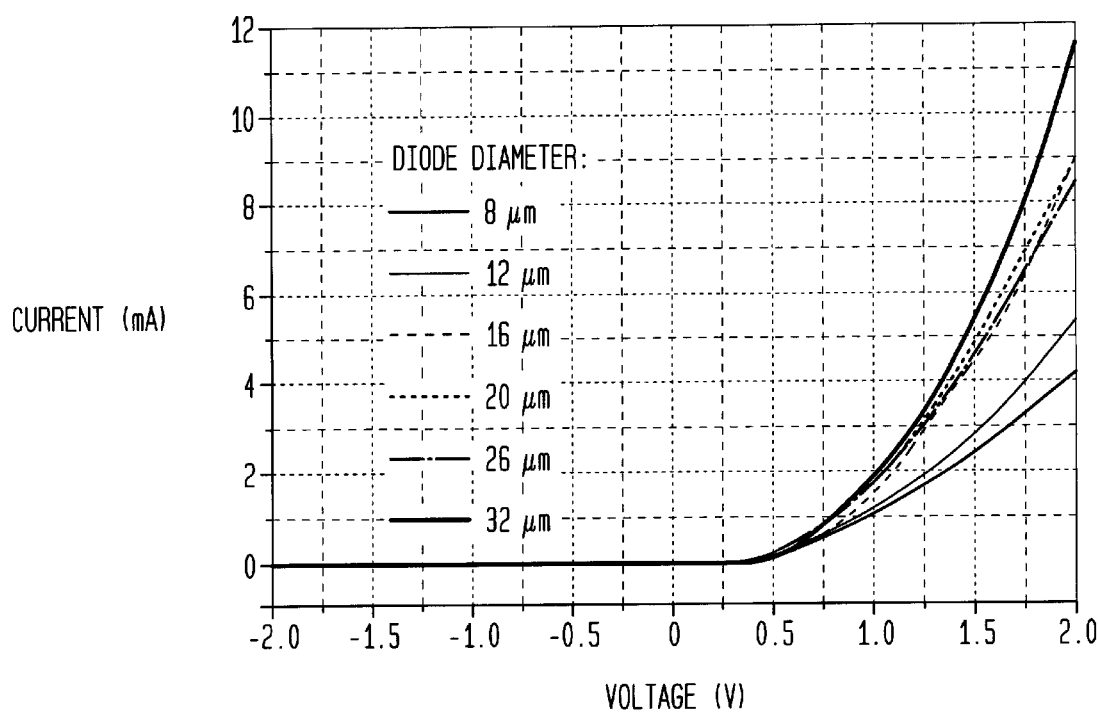
FIG. 3c shows the current-voltage characteristic of devices fabricated using processing steps set forth in present invention.

The use of flip-bonded epitaxial layers provides an inexpensive and reliable VCSEL processing technique. The layers can be bonded using electrically and/or thermally conducting epoxies. The highest process temperature after flip-bonding (similar to FIG. 2) is only about 110° C., which is the temperature needed for baking photoresist in the photolithography process. The higher the maximum temperature needed for processing the thin epitaxial layers, the higher the mismatch in thermal expansion between the bonding material and the semiconductor layers, which might result in cracking of the delicate semiconductor film on the thin wafer itself. By limiting the process temperature, generation of thermal stress induced defects can be minimized. In fact, the inventors have successfully fabricated VCSEL structures using processes similar to the aforementioned approach. FIGS. 3a–3b are photographs that are taken by an infrared camera through a microscope, showing a VCSEL structure (without dielectric DBR 60) with (FIG. 3b) and without (FIG. 3a) driving current. The bright region in FIG. 3b is the spontaneous emission from one pixel. FIG. 3c shows the current-voltage relations of devices with various diameters. The series resistance (~120 Ω for a 32 μm diameter device) is very low compared to conventional VCSELs with double dielectric mirrors. The reverse leakage current is also low (~10 μA at −2V), suggesting that the process does not introduce excessive damage to the epitaxial material.

In conventional flip-chip (or flip-bonded) type alignment, the semiconductor wafer is back-illuminated by a 1.6 μm IR-source and then the existing patterns are imaged with an infra-red camera. However, for the VCSEL process of the present invention, back-illumination to align the top mesa with the bottom mirror will not work, due to the non-transparent nature of indium bumps and metal pads on the surrogate substrate. For this purpose, a novel alignment scheme has been designed that will allow precise alignment (±1 μm) with pre-fabricated features on the other side of the device. The starting top surface is first marked with alignment marks (e.g., via holes/registration marks (40) of FIG. 2b) that are etched into the top epitaxial layers of the wafer using standard dry or wet etching. The VCSEL processing on the top wafer surface proceeds with the formation of VCSEL emission apertures, dielectric mirrors, etc. The array pattern is then registered with respect to the top alignment marks. Then the wafer is flip-bonded onto a surrogate substrate. Since the alignment marks are etched into the epitaxial layers, they become readily visible once the InP substrate is removed. The mesas on the new top surface can then be registered to these alignment marks, thereby ensuring precise alignment with features on the bonded side of a flip-bonded VCSEL wafer.

Figure 4A:
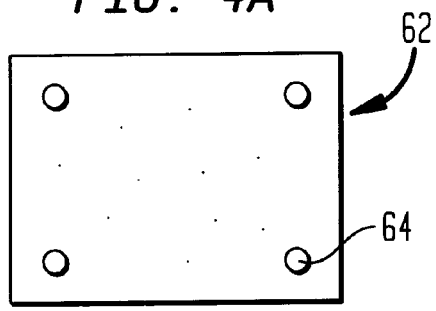
FIGS. 4a–4c present top and side views of a system for registering the InP VCSEL wafer.
Figure 4B:
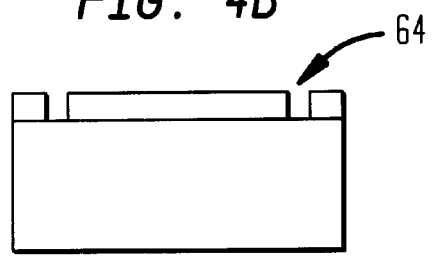
Figure 4C:
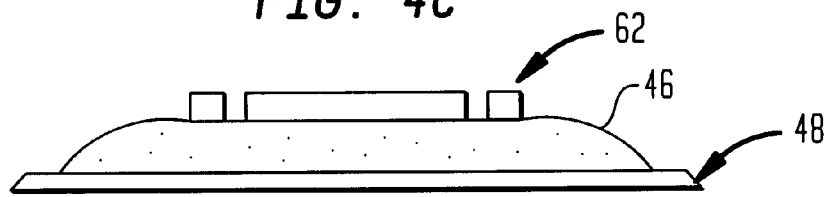
Figure 5:
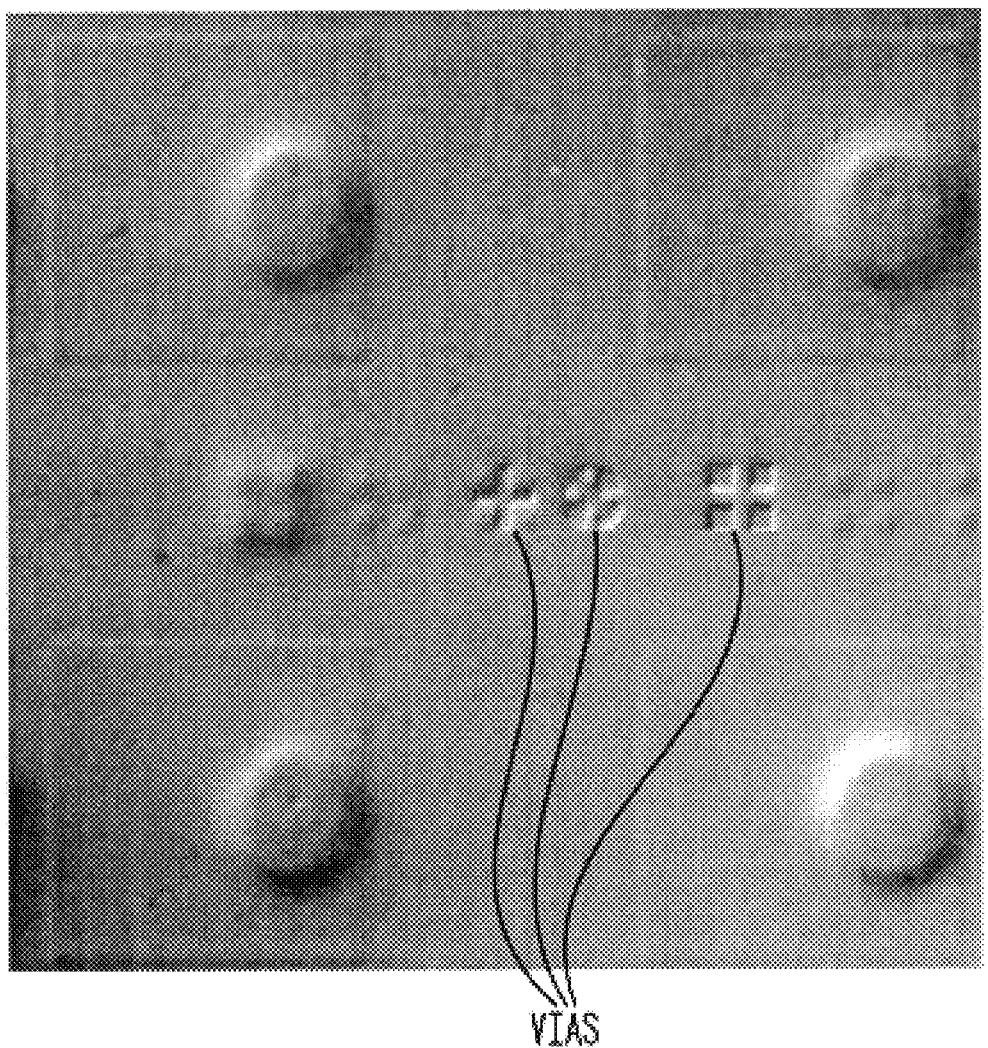
FIG. 5 shows an optical micrograph of registration marks (vias) after InP substrate removal.

FIGS. 4a–4c are top and side views of a system for registering the VCSEL wafer. As can be seen in the figure, registration marks, or via holes (64), are formed in the top 2–3 μm of the VCSEL layers (62) using wet or dry etching. The registration marks, can be made on the top surface before mounting. The actual VCSEL aperture mask on the top surface can be aligned to those holes or marks (64). After processing as shown in FIG. 2, the wafer can be mounted face down on the pre-coated surrogate substrate (48) as shown in FIG. 4c. After removing (etching) the InP substrate, these holes become visible. Thereafter, features on the top surface can be aligned. FIG. 5 shows an optical micrograph of a flip-bonded VCSEL structure, with via holes (64 in FIG. 4) indicated by arrows.

Having thus described the invention in detail, it is to be understood that the foregoing description is not intended to limit the spirit and scope thereof. What is desired to be protected by Letters Patent is set forth in the appended claims.

What is claimed is:

1. A method of manufacturing a VCSEL wafer comprising the steps of:
   a. forming registration marks on the top surface of a VCSEL wafer, said registration marks extending through VCSEL layers to an InP substrate layer;
   b. aligning a VCSEL aperture mask to said registration marks;
   c. mounting said wafer face down on a surrogate substrate;
   d. removing said InP substrate so that said registration marks become visible; and
   e. aligning features on said top surface using said registration marks.

2. The method of claim 1 wherein the step of mounting said wafer face down on a surrogate substrate comprises the substeps of:
   coating said surrogate substrate with metal pads;
   depositing indium bumps on the pads on both the surrogate substrate and the wafer;
   mounting the wafer face down on the surrogate substrate; and
   applying pressure at elevated temperature to bond the wafer and the substrate.

3. The method of claim 1 wherein said registration marks are manifested as holes.

4. The method of claim 1 wherein said registration marks are manifested as ledges.

5. The method of claim 1 wherein said registration marks are manifested as ribs.

6. The method of claim 1 wherein said InP substrate is removed by etching.

7. The method of claim 1 wherein said registration marks are formed on said wafer by wet or dry etching.

8. A method of manufacturing a VCSEL comprising the steps of:
   a. forming an InAsP/InGaAsP MQW VCSEL wafer on an InP substrate;
   b. forming a VCSEL aperture on said wafer;
   c. flip-bonding said wafer onto a surrogate substrate;
   d. removing said InP substrate;
   e. forming a Ti/Pt/Au top ring electrode and contact pad on said wafer;
   f. isolating each VCSEL etching down to near an active region; and
   g. depositing dielectric mirror stack on said isolated VCSEL.

9. The method of claim 8 wherein said wafer is formed by contact metalization.

10. The method of claim 8 further including the step of depositing a dielectric mirror stack at each VCSEL opening.

11. The method of claim 8 wherein said surrogate substrate is coated with In metal or Si-epoxy and In by a bump bonding technique.

12. The method of claim 8 wherein said surrogate substrate is coated with metal pads.

13. The method of claim 8 wherein said surrogate substrate is selected from one of the substrate materials: silicon, sapphire or diamond.

14. The method of claim 8 wherein said surrogate substrate includes CMOS circuitry.

15. The method of claim 8 wherein said surrogate substrate includes other processed silicon, SiGe, SiC or GaAs circuitry.

16. The method of claim 8 wherein said InP substrate is removed by etching.

17. The method of claim 16 wherein said etching is carried out using an $HCl:H_3PO_4$ mixture.

18. The method of claim 8 wherein said top ring electrode and said contact pad are formed by a photolithographic process and etching.

19. The method of claim 8 wherein said dielectric mirror stacks are formed of material selected from $Si/SiO_2$, $Si/Al_2O_3$, $Si/MgO$, $Si/MgF_2$, $ZnSe/MgF_2$, $TiO_2/SiO_2$, $TiO_2/Al_2O_3$, $SiC/MgF_2$, $SiC/MgO$ or $SiC/Al_2O_3$.

20. The method of claim 8 wherein said dielectric mirror stacks are formed by e-beam or sputtering and lift off.

21. A method of manufacturing a VCSEL comprising the steps of:
   a. forming registration marks on the top surface of a VCSEL wafer, said registration marks extending through VCSEL layers to an InP substrate layer;
   b. aligning a VCSEL aperture mask to said registration marks;
   c. flip-bonding said wafer onto a surrogate substrate;
   d. removing said InP substrate so that said registration marks become visible;
   e. aligning features on said top surface using said registration marks;
   f. forming a Ti/Pt/Au top ring electrode and contact pad on said wafer;
   g. isolating each VCSEL etching down to near an active region; and
   h. depositing dielectric mirrors on said isolated VCSEL.

22. The method of manufacturing a VCSEL of claim 21 further including the use of in-situ monitoring techniques during dielectric mirror deposition.

23. The method of manufacturing a VCSEL of claim 21 wherein said wafer is established to have separate portions, a first portion for said VCSEL and a second portion for an operating device.

24. The method of manufacturing a VCSEL of claim 21 wherein the step of flip-bonding said wafer onto said surrogate substrate includes the substep of:
   applying a thermally conducting, low-viscosity underfilling epoxy at the bonding surface of said surrogate substrate.

25. The method of manufacturing a VCSEL of claim 21 wherein the step of flip-bonding said wafer onto said surrogate substrate comprises the substeps of:
   coating said surrogate substrate with metal pads;
   depositing indium bumps on the pads on both the surrogate substrate and the wafer;
   applying a thermally conducting, low-viscosity underfilling epoxy at the bonding surface of said surrogate substrate;
   mounting the wafer face down on the surrogate substrate; and
   applying pressure at elevated temperature to bond the wafer and the substrate.

* * * * *